United States Patent [19]
Hayashi et al.

[11] Patent Number: 6,108,249
[45] Date of Patent: Aug. 22, 2000

[54] SEMICONDUCTOR MEMORY DEVICE HAVING DELAY CIRCUIT FOR CONTROLLING TIMING OF INTERNAL CONTROL SIGNAL

[75] Inventors: Isamu Hayashi; Akira Yamazaki, both of Hyogo, Japan

[73] Assignee: Mitsubishi Denki Kabushiki Kaisha, Tokyo, Japan

[21] Appl. No.: 09/227,938

[22] Filed: Jan. 11, 1999

[30] Foreign Application Priority Data

Aug. 5, 1998 [JP] Japan .................................. 10-221578

[51] Int. Cl.⁷ ........................................................ G11C 7/00
[52] U.S. Cl. ........................ 365/194; 365/226; 365/189.05
[58] Field of Search ................................... 365/194, 226, 365/189.05, 189.11

[56] References Cited

U.S. PATENT DOCUMENTS 5,136,542  8/1992  Abe et al. .......................... 365/189.05
5,461,585  10/1995  Chonan .................................. 365/194

FOREIGN PATENT DOCUMENTS 3-175720  7/1991  Japan .

*Primary Examiner*—Huan Hoang
*Attorney, Agent, or Firm*—McDermott, Will & Emery

[57] ABSTRACT

An output buffer receives a voltage from a first power supply pin receiving an external power supply voltage for operation. Delay circuits included in an array control circuit, a read control circuit, a write control circuit and an internal clock generation circuit receive a voltage from a second power supply pin receiving the external power supply voltage for operation. Thus, a timing control is accurately performed for reading/writing a data signal without being affected by the change in power supply voltage due to an operation of the output buffer.

10 Claims, 4 Drawing Sheets

SEMICONDUCTOR MEMORY DEVICE HAVING DELAY CIRCUIT FOR CONTROLLING TIMING OF INTERNAL CONTROL SIGNAL

BACKGROUND OF THE INVENTION

1. Field of the Invention

The present invention relates to semiconductor memory devices and, more specifically to a semiconductor memory device having a delay circuit for controlling a timing of an internal control signal.

2. Description of the Background Art

In a semiconductor memory device called a DRAM (Dynamic Random Access Memory), an internal control signal is generated by a control circuit in response to an external control signal such as a row address strobe signal /RAS or column address strobe signal /CAS. The internal control signal controls an operation of each circuit in the DRAM and, for example, activates a signal, which determines a timing at which a word line is activated, or a sense amplifier. The word line, sense amplifier or the like is activated in response to the rise or fall of the internal control signal. A timing at which the internal control signal rises or falls is controlled by a delay amount from a delay circuit provided in the control circuit. The delay circuit includes a buffer and a capacitor.

When a power supply voltage supplied for the delay circuit provided in the control circuit changes, a driving current for the buffer also changes accordingly, whereby the delay amount from the delay circuit changes. Thus, the power supply voltage supplied for the delay circuit in the control circuit is desirably kept at a constant level. In a conventional DRAM shown in FIG. 6, however, a power supply voltage VDD supplied for an output buffer 100 and that supplied for a delay circuit DL0 in a control circuit CTL0 are both supplied from a power supply pin P0. In addition, the change in the power supply voltage due to an operation of output buffer 100 is generally large. Accordingly, the power supply voltage supplied for delay circuit DL0 in control circuit CTL0 considerably changes by the operation of output buffer 100. As a result, the delay amount from delay circuit DL0 in control circuit CTL0 changes, thereby seriously hindering an accurate timing control for a reading/writing operation of a data signal.

SUMMARY OF THE INVENTION

An object of the present invention is to provide a semiconductor memory device capable of performing an accurate timing control for reading/writing a data signal without being affected by the change in a power supply voltage due to an operation of an output buffer.

The semiconductor memory device according to one aspect of the present invention includes a memory cell array, first and second power supplies, an output buffer and a control circuit. The memory cell array includes a plurality of memory cells a-ranged in a matrix. The output buffer receives a voltage from the first power supply for operation and externally outputs a data signal from the memory cell array. The control circuit controls reading/writing of the data signal from the memory cell array. The control circuit includes a control signal generation circuit and a delay circuit. The control signal generation circuit generates an internal control signal in response to an external control signal. The delay circuit receives a voltage from the second power supply for operation and delays the internal control signal from the control signal generation circuit. The second power supply supplies the voltage only for the delay circuit.

In the above mentioned semiconductor memory device, the output buffer and the delay circuit in the control circuit respectively receive voltages from the fist and second power supplies for operation. Thus, even when the power supply voltage supplied for the output buffer from the first power supply changes due to an operation of the output buffer, the delay circuit normally operates as the power supply voltage supplied for the delay circuit from the second power supply is not affected. As a result, a timing for reading/writing the data signal is accurately controlled without being affected by the change in the power supply voltage due to the operation of the output buffer. Further, as the second power supply supplies the power supply voltage only for the delay circuit, the delay circuit normally operates even when there is a change in the power supply voltage for circuits other than the output buffer.

The semiconductor memory device according to another aspect of the present invention includes a memory cell array, first and second power supply pins, an output buffer and a control circuit. The memory cell array includes a plurality of memory cells arranged in a matrix. The first and second power supply pins receive an external power supply voltage. The output buffer receives the voltage from the first power supply pin for operation and externally outputs a data signal from the memory cell array. The control circuit controls reading/writing of the data signal from the memory cell array. The control circuit includes a control signal generation circuit and a delay circuit. The control signal generation circuit generates an internal control signal in response to an external control signal. The delay circuit receives the voltage from the second power supply pin for operation and delays the internal control signal from the control signal generation circuit.

In the above mentioned semiconductor memory device, the output buffer and the delay circuit in the control circuit respectively receive voltages from the first and second power supply pins for operation. In addition, an external power supply voltage externally supplied for the first and second power supply pins is stabilized. Thus, even when the power supply voltage supplied for the output buffer from the first power supply pin changes due to an operation of the output buffer, the delay circuit normally operates as the power supply voltage supplied for the delay circuit from the second power supply pin is not affected. As a result, a timing for reading/writing the data signal is accurately controlled without being affected by the change in the power supply voltage due to the operation of the output buffer.

A semiconductor memory device according to still another aspect of the present invention includes a memory cell array, first and second power supply pins, an internal power supply circuit, an output buffer and a control circuit. The memory cell array includes a plurality of memory cells arranged in a matrix. The first and second power supply pins receive an external power supply voltage. The internal power supply circuit receives the voltage from the second power supply pin for generating an internal power supply voltage which is lower than the voltage from the second power supply pin. The output buffer receives the voltage from the first power supply pin for operation and externally outputs a data signal from the memory cell array. The control circuit controls reading/writing of the data signal from the memory cell array. The control circuit includes a control signal generation circuit and a delay circuit. The control signal generation circuit generates an internal control signal in response to an external control signal. The delay circuit receives the internal power supply voltage from the internal power supply circuit for operation and delays the internal control signal from the control signal generation circuit.

In the above mentioned semiconductor memory device, the output buffer and the delay circuit in the control circuit respectively receive the voltage from the first power supply pin and the internal power supply voltage from the internal power supply circuit for operation. In addition, the stable internal power supply voltage is always supplied from the internal power supply circuit. Thus, even when the power supply voltage supplied for the output buffer from the first power supply pin changes due to an operation of the output buffer, the delay circuit normally operates as the internal power supply voltage supplied for the delay circuit from the internal power supply circuit is not affected. As a result, a timing for reading/writing the data signal is accurately controlled without being affected by the change in the power supply voltage due to the operation of the output buffer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
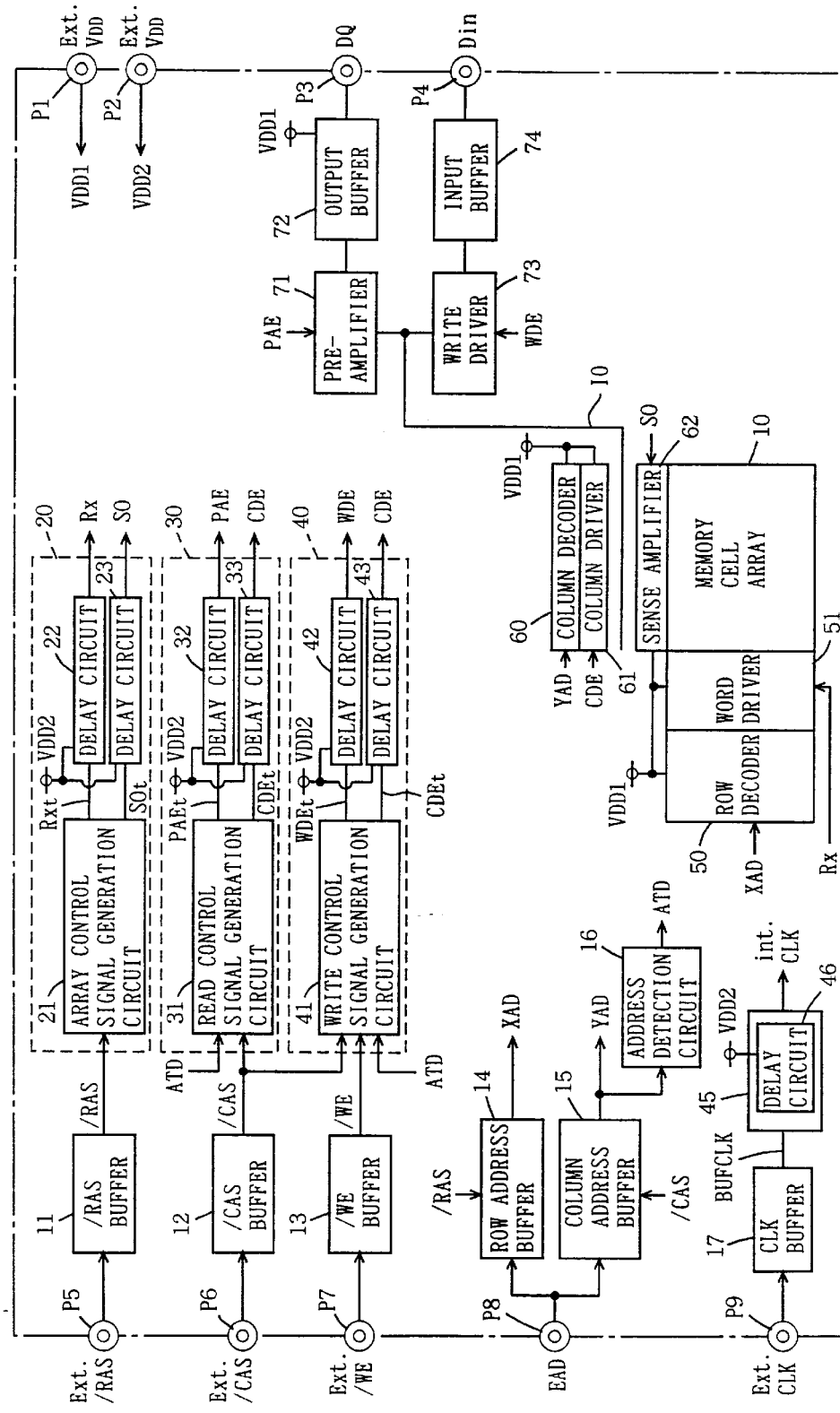
FIG. 1 is a block diagram showing an overall arrangement of a DRAM according to a first embodiment of the present invention.

Embodiments of the present invention will now be described in detail with reference to the drawings. It is noted that the same or corresponding portions in the drawings are denoted by the same reference characters and the description thereof will not be repeated.

First Embodiment

Referring to FIG. 1, a synchronous DRAM includes: power supply pins P1 and P2 receiving an external power supply voltage Ext.VDD; data input/output pins P3 and P4; a row address strobe pin Pa receiving an external row address strobe signal Ext./RAS; a column address strobe pin P6 receiving an external column address strobe signal Ext./CAS; a write enable pin P7 receiving an external write enable signal Ext./WE; an address pin P8 receiving an external address signal EAD; a clock signal pin P9 receiving an external clock signal Ext.CLK; a memory cell array 10; a row address strobe (/RAS) buffer 11; a column address strobe (/CAS) buffer 12; a write enable (/WE) buffer 13; a row address buffer 14; a column address buffer 15; an address detection circuit 16; a clock (CLK) buffer 17; an array control circuit 20; a read control circuit 30, a write control circuit 40; an internal clock generation circuit 45; a row decoder 50; a word driver 51; a column decoder 60; a column diver 61; a sense amplifier 62; a preamplifier 71; an output buffer 72; a write driver 73; and an input buffer 74.

Memory cell array 10 includes a plurality of memory cells (not shown) arranged in a matrix, a plurality of word lines (not shown) corresponding to rows, and a plurality of pairs of bit lines (not shown) corresponding to columns. /RAS buffer 11 generates a row address strobe signal /RAS in response to external row address strobe signal Ext./RAS. /CAS buffer 12 generates a column address strobe signal /CAS in response to external column address strobe signal Ext./CAS. /WE buffer 13 generates a write enable signal /WE in response to external write enable signal Ext./WE. Row address buffer 14 supplies external address signal EAD for row decoder 50 as a row address signal XAD in response to row address strobe signal /RAS. Column address buffer 15 supplies external address signal EAD for column decoder 60 as a column address signal YAD in response to column address strobe signal /CAS. Address detection circuit 16 detects a change in column address signal YAD and, responsively, generates a detection signal ATD. CLK buffer 17 generates a clock buffer signal BUFCLK in response to external clock signal Ext.CLK.

Array control circuit 20 includes an allay control signal generation circuit 21 and delay circuits 22 and 23. Array control signal generation circuit 21 generates control signals Rxt and S0t in response to row address strobe signal /RAS. Delay circuit 22 receives a voltage VDD2 from power supply pin P2 for operation, and delays control signal Rxt by a prescribed period of time for outputting it to word driver 51 as a word line driving signal Rx. Delay circuit 23 receives voltage VDD2 from power supply pin P2 for operation, and delays control signal S0t by a prescribed period of time for outputting it to sense amplifier 62 as a sense amplifier activation signal S0.

Read control circuit 30 includes a read control signal generation circuit 31 and delay circuits 32 and 33. Read control signal generation circuit 31 generates control signals PAEt and CDEt in response to column address strobe signal /CAS and detection signal ATD. Delay circuit 32 receives voltage VDD2 from power supply pin P2 for operation, and delays control signal PAEt by a prescribed period of time for outputting to preamplifier 71 as a preamplifier activation signal PAE. Delay circuit 33 receives voltage VDD2 from power supply pin P2 for operation, and delays control signal CDEt by a prescribed period of time for outputting it to column driver 61 as a column decode enable signal CDE.

Write control circuit 40 includes a write control signal generation circuit 41 and delay circuits 42 and 43. Write control signal generation circuit 41 generates control signals WDEt and CDEt in response to column address strobe signal /CAS, internal write enable signal /WE and detection signal ATD. Delay circuit 42 receives voltage VDD2 from power supply pin P2 for operation, and delays control signal WDEt by a prescribed period of time for outputting it to write driver 73 as a write data enable signal WDE. Delay circuit 43 receives voltage VDD2 from power supply pin P2 for operation, and delays control signal CDEt by a prescribed period of time for outputting it to column driver 61 as a column decode enable signal CDE.

Internal clock generation circuit 45 includes a delay circuit 46 which receives voltage VDD2 from power supply pin P2 for operation, and outputs an internal clock signal int.CLK in response to clock buffer signal BUFCLK. Delay circuit 46 controls a timing at which internal clock signal int.CLK rises or falls.

Row decoder 50 receives voltage VDD1 from power supply pin P1 for operation, and selects a row (a word line) of memory cell array 10 in response to row address signal XAD from row address buffer 14. Word driver 51 receives voltage VDD1 from power supply pin P1 for operation, and boosts a voltage of the word line selected by row decoder 50 to a voltage which is higher than the power supply voltage. Column decoder 60 receives voltage VDD1 from power supply pin P1 for operation, and selects a column (a pair of bit lines) of memory cell array 10 in response to column address signal YAD from column address buffer 15. Column driver 61 receives voltage VDD1 from power supply pin P1 for operation, turns a column selection gate (not shown) on in response to row decode enable signal CDE and connects the pair of bit lines selected by column decoder 60 and an input/output line IO. Sense amplifier 62 receives voltage VDD1 from power supply pin P1 for operation, and amplifies a data signal read from a memory cell (not shown) in memory cell array 10 in response to sense amplifier activation signal S0. Preamplifier 71 amplifies the data signal read to input/output line IO from the memory cell (not shown) in memory cell array 10 for supplying it for output buffer 72 in response to preamplifier activation signal PAE. Output buffer 72 receives voltage VDD1 from power supply pin P1 for operation, and outputs the data signal from preamplifier 71 to input/output pin P3. The signal turns to an external output data signal DQ. Input buffer 74 buffers an external input data signal Din for outputting it to write driver 73. Write driver 73 supplies the data signal from input buffer 74 for input/output line IO in response to write data enable signal WDE.

Figure 2:
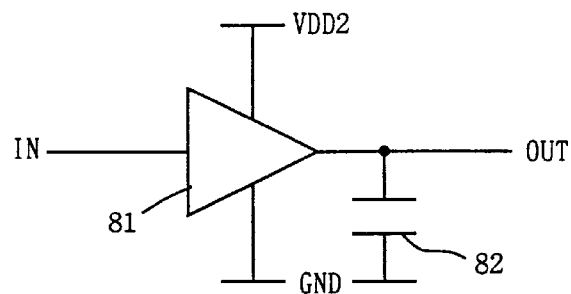
FIG. 2 is a block diagram showing an arrangement of a delay circuit shown in FIG. 1.

FIG. 2 is a block diagram showing an arrangement of each of delay circuits 22, 23, 32, 33, 42, 43 and 46 shown in FIG. 1. Referring to FIG. 2, delay circuits 22, 23, 32, 33, 42, 43 and 46 includes a buffer 81 and a capacitor 82. Buffer 81 is connected between a power supply node VDD2 receiving voltage VDD2 from power supply pin P2 and a ground node GND, and delays an input signal IN by a prescribed period of time for outputting it to an output node OUT. The delay time is set at a desired value, for example by adjusting the size of buffer 81. Capacitor 82 is connected between output node OUT of buffer 81 and ground node GND.

An operation of thus structured DRAM will now be described.

Each portion of the above described synchronous DRAM operates in synchronization with the rise or fall of internal clock signal int.CLK. Thus, a timing at which the internal clock signal rises or falls must always be accurate. The timing at which internal clock signal int.CLK rises or falls is determined by a delay amount from delay circuit 46.

Next, operations for (a) reading the data signal from the memory cell and for (b) writing the data signal to the memory cell will be described.

(a) Reading the data signal from the memory cell

When row address strobe signal /RAS falls, external address signal EAD at the time is supplied for row decoder 50 as row address signal XAD by row address buffer 14. Subsequently, a word line, which is arranged in a row including a memory cell to be accessed, is selected by row decoder 50. On the other hand, control signals Rxt and S0t are generated in array control signal generation circuit 21 in response to the fall of row address strobe signal /RAS. Control signal Rxt is delayed by a prescribed period of time by delay circuit 22 and supplied for word driver 51 as a word line driving signal Rx (a pulse signal which rises for a prescribed period of time). Word driver 51 boosts a voltage of the word line selected by row decoder 50 to a voltage which is higher than the power supply voltage in response to the rise of word line driving signal Rx. When the voltage of the selected word line is boosted, a small potential difference arises between a corresponding pair of bit lines due to electric charges accumulated in the memory cell.

Thus, the voltage of the word line must be boosted in accordance with the timing at which the word line is selected by row decoder 50. Therefore, the timing at which word line driving signal Rx rises is important. The timing at which word line driving signal Rx rises is determined by a delay amount from delay circuit 22 as described above.

Thereafter, sense amplifier activation signal S0 rises to an H level and, responsively, sense amplifier 62 amplifies the small potential difference between the pair of bit lines to a potential difference VDD. A timing at which sense amplifier activation signal S0 rises at the time is determined by a delay amount from delay circuit 23.

After row address strobe signal /RAS falls, when column address strobe signal /CAS falls, external address signal EAD at the time is supplied for column decoder 60 as column address signal YAD by column address buffer 15. Subsequently, a pair of bit lines corresponding to the memory cell to be accessed is selected by column decoder 60.

On the other hand, control signals PAEt and CDEt are generated in read control signal generation circuit 31 in response to the fall of column address strobe signal /CAS and detection signal ATD. Control signal CDEt is delayed by a prescribed period of time by delay circuit 33 and supplied for column driver 61 as column decode enable signal CDE. Column driver 61 turns a column selection gate on which corresponds to the pair of bit lines selected by column decoder 60 and connects the pair of bit lines and input/output line 10 in response to the rise or fall of column decode enable signal CDE. Thus, potential difference VDD between the pair of bit lines which has been amplified by sense amplifier 62 is transmitted to a pair of input/output lines IO.

As described above, the corresponding column selection gate must be turned on in accordance with the timing at which the pair of bit lines is selected by column decoder 60. Therefore, the timing at which column decode enable signal CDE rises or falls is important. The timing at which column decode enable signal CDE rises or falls is determined by a delay amount from delay circuit 33.

Control signal PAEt generated in read control signal generation circuit 31 is delayed by a prescribed period of time by delay circuit 32 and supplied for preamplifier 71 as a preamplifier enable signal PAE. Preamplifier 71 amplifies potential difference VDD transmitted to input/output line IO for supplying it for output buffer 72 in response to the rise or fall of preamplifier enable signal PAE. Thus, preamplifier 71 must be activated in accordance with a timing at which potential difference VDD between the pair of a bit lines which has been amplified by sense amplifier 62 is transmitted to pair of input/output lines IO. Accordingly, the timing at which preamplifier enable signal PAE rises or falls is important. The timing at which preamplifier enable signal PAE rises or falls is determined by a delay amount from delay circuit 32.

Output buffer 72 receives a signal which has been amplified by preamplifier 71 for outputting it to input/output pin P3. Thus, data of the selected memory cell is output as an external output data signal DQ.

As described above, the timing at which word line driving signal Rx, sense amplifier activation signal is S0, column decode enable signal CDE and preamplifier activation signal PAE rise or fall determines a timing for an operation of each portion of the DRAM in reading data from the memory cell. In addition, the twang at which these signals rise or fall is determined by delay amounts from delay circuits 22, 23, 32 and 33.

(b) Writing the data signal to the memory cell

As in the case of the above described (a), a word line and a pair of bit lines corresponding to a memory cell for which writing operation is performed are selected.

External input data signal Din from input/output pin P4 is buffered by input buffer 74 and supplied for write driver 73.

Control signals WDEt and CDEt are generated in write control signal generation circuit 41 in response to the fall of column address strobe signal /CAS and detection signal ATD.

Control signal WDEt generated in write control signal generation circuit 41 is delayed by a prescribed period of time by delay circuit 42 and supplied for write driver 73 as a write data enable signal WDE. Write driver 73 outputs a data signal from input buffer 74 to input/output line 10 in response to the rise or fall of write data enable signal WDE.

Thus, write driver 73 must be activated in accordance with the timing at which external input data signal Din is incorporated by input buffer 74. Accordingly, the timing at which write data enable signal WDE rises or falls is important. The timing at which write enable signal WDE rises or falls is determined by a delay amount from delay circuit 42.

Control signal CDEt is delayed by a prescribed period of time by delay circuit 43 and supplied for column driver 61 as a column decode enable signal CDE. Column driver 61 turns on a column selection gate which corresponds to a pair of bit lines selected by column decoder, and connect the pair of bit lines and input/output line IO. Thus, a potential difference VDD of input/output line 10 is transmitted to the pair of bit lines, and data is written to the memory cell.

As described above, the corresponding column selection gate must be turned on in accordance with the timing at which the data signal from input buffer 74 is output to input/output line IO by write driver 73. Accordingly, the timing at which column decode enable signal CDE rises or falls is important. The timing at which column decode enable signal CDE rises or falls is determined by a delay amount from delay circuit 43.

As in the foregoing, the timing at which write data enable signal WDE and column decode enable signal CDE rise or fall determines a timing for an operation of each portion of the DRAM in writing data to the memory cell. In addition, the timing at which signals rise or fall is determined by the delay amounts from delay circuits 42 and 43.

Figure 3:
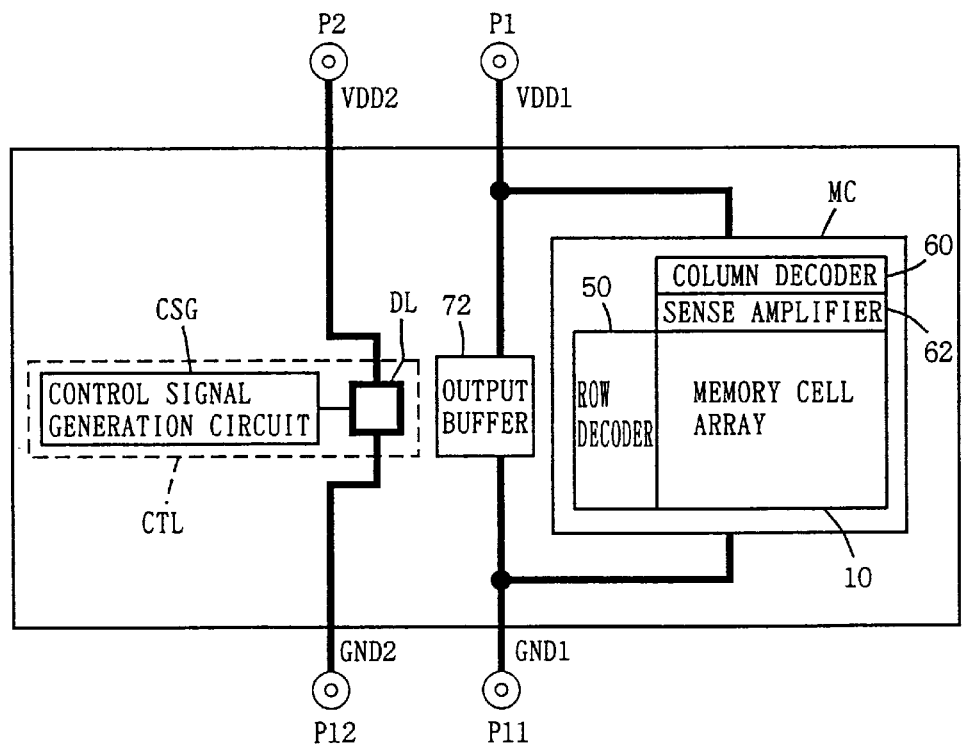
FIG. 3 is a block diagram showing a power supply system for the synchronous DRAM shown in FIG. 1.

FIG. 3 is a block diagram showing a power supply system of the synchronous DRAM according to the first embodiment of the present invention. A control circuit CTL includes array control circuit 20, read control circuit 30, write control circuit 40 and internal clock generation circuit 45 shown in FIG. 1. A control signal generation circuit CSG includes array, read and write control signal generation circuits 21, 31 and 41 shown in FIG. 1. Further, a delay circuit DL includes delay circuits 22, 23, 32, 33, 42, 43 and 46 shown in FIG. 1.

The synchronous DRAM is provided with power supply pins P1 and P2 respectively for output buffer 72 and delay circuit DL, so that power supply voltages VDD1 and VDD2 respectively applied for output buffer 72 and delay circuit DL are disconnected by the power supply pins. Further, although not shown in FIG. 1, ground voltages GND1 and GND2 respectively for output buffer 72 and delay circuit DL are disconnected from the power supply pins by provision of ground pins P11 and P12, which are for output buffer 72 and delay circuits DL. It is noted that a memory array portion MC including memory cell array 10, row decoder 50, column decoder 60 and sense amplifier 62 receives power supply voltage VDD1 and ground voltage GND1 from power supply pin P1 and ground pin P11 which are also used by output buffer 72.

Generally, as a large amount of power is consumed for the operation of output buffer 72, power supply voltage VDD1 supplied for output buffer 72 VDD may change. According to the first embodiment, however, power supply voltages VDD1 and VDD2 respectively supplied for output buffer 72 and delay circuit DL are disconnected from the power supply pins, and ground voltages GND1 and GND2 respectively for output buffer 72 and delay circuit DL are also disconnected from the power supply pins. Therefore, even when power supply voltage VDD1 changes due to the operation of output buffer 72, power supply voltage VDD2 for delay circuit DL is stabilized without being affected. Thus, an accurate timing control is performed for reading/writing the data signal.

Second Embodiment

Figure 4:
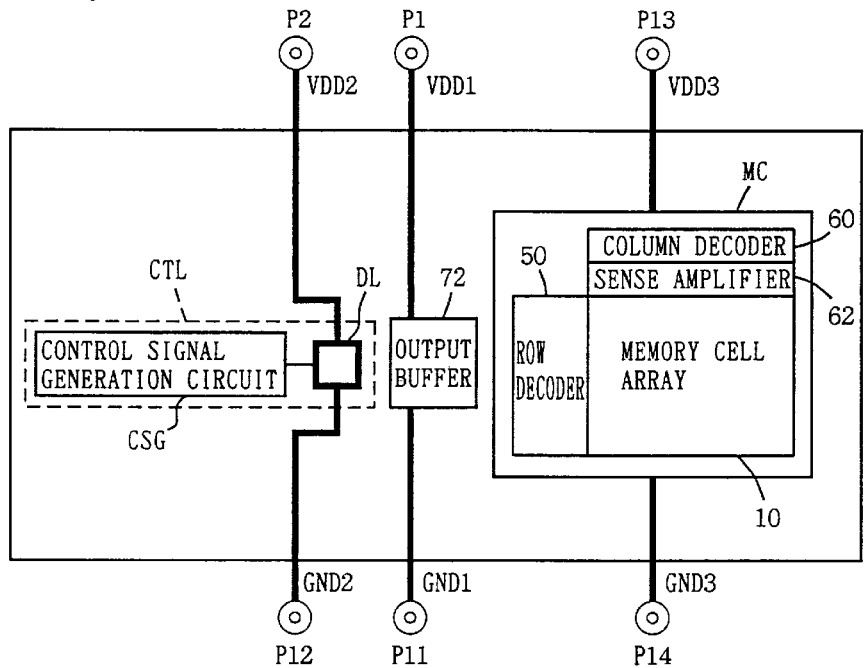
FIG. 4 is a block diagram showing a power supply system for a synchronous DRAM according to a second embodiment of the present invention.

Referring to FIG. 4, a synchronous DRAM includes a power supply pin P13 and a ground pin P14 respectively receiving external power supply voltage Ext.VDD and ground voltage GND in addition to the structure shown in FIGS. 1 and 3. Memory array portion MC receives a power supply voltage VDD3 from power supply pin P13 and a ground voltage GND3 from ground pin P14.

The synchronous DRAM is provided with power supply pins P1, P2 and P13 respectively for output buffer 72, delay circuit DL and memory array portion MC, so that power supply voltages VDD1, VDD2 and VDD3 respectively supplied for output buffer 72, delay circuit DL and memory array portion MC are disconnected from the power supply pins. In addition, ground voltages GND1, GND2 and GND3, which are respectively for output buffer 72, delay circuit DL and memory array portion MC, are disconnected from the power supply pins by provision of ground pins P11, P12 and P14 respectively for output buffer 72, delay circuit DL and memory array portion MC. Thus, an effect which is similar to that in the case of the first embodiment is obtained, and memory array portion MC is not affected by the change in power supply voltage VDD1 due to the operation of output buffer 72.

Third Embodiment

Figure 5:
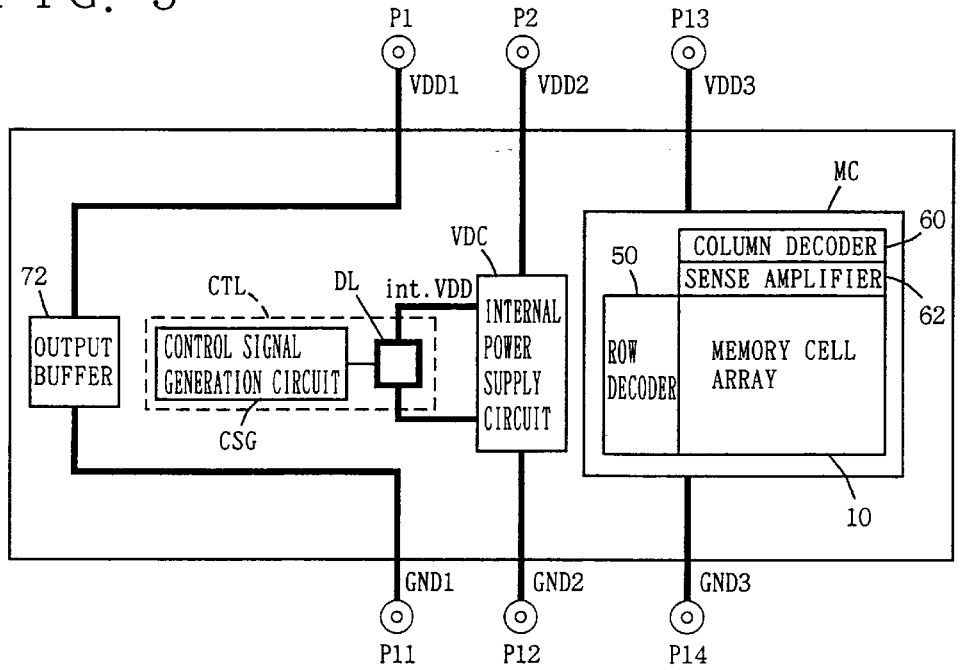
FIG. 5 is a block diagram showing a power supply system for a synchronous DRAM according to a third embodiment of the present invention.
Figure 6:
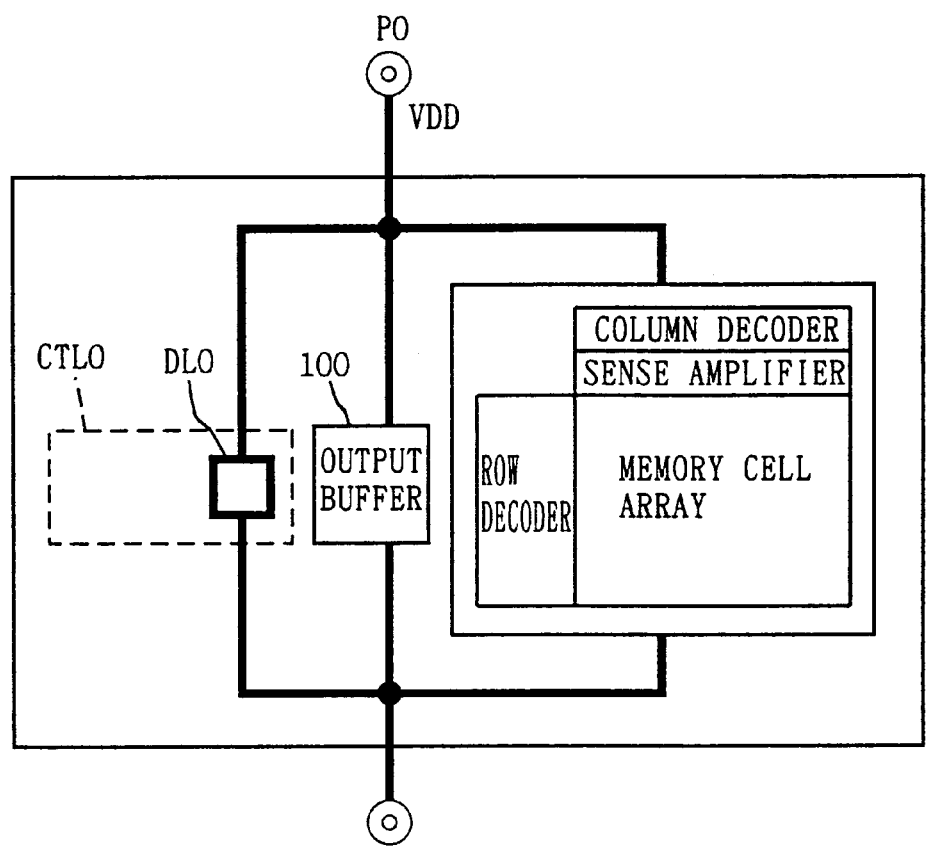
FIG. 6 is a block diagram showing a power supply system for a conventional DRAM.

Referring to FIG. 5, a synchronous DRAM is provided with an internal power supply circuit VDC in addition to the structure shown in FIG. 4. Internal power supply circuit VDC receives power supply voltage VDD2 from power supply pin P2 for generating an internal power supply voltage int.VDD which is lower than power supply voltage VDD2.

Delay circuit DL receives internal power supply voltage int.VDD from internal power supply circuit VDC for operation. As internal power supply circuit VDC generates stable internal power supply voltage int.VDD even when power supply voltage VDD2 changes. Thus, even if power supply VDD2 is affected by the change in power supply voltage VDD1 due to the operation of output buffer 72, internal power supply voltage int.VDD supplied for delay circuit DL is not affected. Therefore, an accurate timing control is performed for reading/writing the data signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in a matrix;
   first and second power supplies;
   an output buffer for receiving a voltage from said first power supply for operation and for externally outputting a data signal from said memory cell array; and
   a control circuit for controlling reading of the data signal from said memory cell array, said control circuit including
   a control signal generation circuit for generating an internal control signal in response to an external control signal, and
   a delay circuit for receiving a voltage from said second power supply for operation and delaying the internal control signal from said control signal generation circuit,
   said second power supply supplying the voltage only for said delay circuit.

2. A semiconductor memory device, comprising:
   a memory cell array having a plurality of memory cells arranged in a matrix;
   first and second power supply pins distinct from each other, for receiving an external power supply voltage external to the semiconductor memory device;
   an output buffer for receiving the voltage from said first power supply pin for operation and externally outputting a data signal from said memory cell array; and
   a control circuit for controlling reading of the data signal from said memory cell array, said control circuit including
   a control signal generation circuit for generating an internal control signal in response to an external control signal, and
   a delay circuit for receiving the voltage from said second power supply pin for operation and delaying the internal control signal from said control signal generation circuit.

3. A semiconductor memory device comprising:
   a memory cell array having a plurality of memory cells arranged in a matrix;
   first and second power supply pins for receiving an external power supply voltage;
   an output buffer for receiving the voltage from said first power supply pin for operation and externally outputting a data signal from said memory cell array; and
   a control circuit for controlling reading of the data signal from said memory cell array, said control circuit including:
   a control signal generation circuit for generating an internal control signal in response to an external control signal, and
   a delay circuit receiving the voltage from said second power supply pin for operation and delaying the internal control signal from said control signal generation circuit;
   said semiconductor memory device further comprising:
   a row decoder for receiving the voltage from said first power supply pin for operation and selecting a row of said memory cell array in response to a row address signal; and
   a column decoder for receiving the voltage from said first power supply pin for operation and selecting a column of said memory cell array in response to a column address signal.

4. The semiconductor memory device according to claim 3, further comprising:
   a sense amplifier for receiving the voltage from said first power supply pin for operation and amplifying the data signal read from the memory cell in said memory cell array.

5. A semiconductor memory device comprising:
   a memory cell array having a plurality of memory cells arranged in a matrix;
   first and second power supply pins for receiving an external power supply voltage;
   an output buffer for receiving the voltage from said first power supply pin for operation and externally outputting a data signal from said memory cell array; and
   a control circuit for controlling reading of the data signal from said memory cell array, said control circuit including
   a control signal generation circuit for generating an internal control signal in response to an external control signal, and
   a delay circuit for receiving the voltage from said second power supply pin for operation and delaying the internal control signal from said control signal generation circuit;
   said semiconductor memory device further comprising:
   a third power supply pin for receiving said external power supply voltage;
   a row decoder for receiving a voltage from said third power supply pin for operation and selecting a row of said memory cell array in response to a row address signal; and
   a column decoder for receiving the voltage from said third power supply pin for operation and selecting a column of said memory cell array in response to a column address signal.

6. The semiconductor memory device according to claim 5, further comprising:
   a sense amplifier for receiving the voltage from said third power supply pin for operation and amplifying the data signal read from the memory cell in said memory cell array.

7. A semiconductor memory device, comprising:
   a memory cell array having a plurality of memory cells arranged in a matrix;
   first and second power supply pins for receiving an external power supply voltage;
   an internal power supply circuit for receiving the voltage from said second power supply pin for generating an internal power supply voltage lower than the voltage from said second power supply pin;
   an output buffer for receiving the voltage from said first power supply pin for operation and externally outputting a data signal from said memory cell array; and
   a control circuit for controlling reading of the data signal from said memory cell array, said control circuit including a control signal generation circuit for generating an internal control signal in response to an external control signal, and a delay circuit for receiving the internal power supply voltage from said internal power supply circuit for operation and delaying the internal control signal from said control signal generation circuit.

8. The semiconductor memory device according to claim 7, further comprising:

a third power supply pin receiving said external power supply voltage;

a row decoder receiving the voltage from said third power supply pin for operation and selecting a row of said memory cell array in response to a row address signal;

a column decoder receiving the voltage from said third power supply pin for operation and selecting a column of said memory cell array in response to a column address signal; and a sense amplifier receiving the voltage from said third power supply pin for operation and amplifying the data signal read from the memory cell in said memory cell array.

9. The semiconductor memory device according to claim 7, further comprising:

a third power supply pin for receiving said external power supply voltage;

a row decoder for receiving the voltage from said third power supply pin for operation and selecting a row of said memory cell array in response to a row address signal; and a column decoder for receiving the voltage from said third power supply pin for operation and selecting a column of said memory cell array in response to a column address signal.

10. A semiconductor memory device, comprising:

a memory cell array having a plurality of memory cells arranged in a matrix;

first and second power supply pins, electrically disconnected from each other, for receiving external power supply voltages;

an output buffer for receiving the voltage from said first power supply pin for operation and externally outputting a data signal from said memory cell array; and a control circuit for controlling reading of the data signal from said memory cell array, said control circuit including:

a control signal generation circuit for generating an internal control signal in response to an external control signal, and a delay circuit for receiving the voltage from said second power supply pin for operation and delaying the internal control signal from said control signal generation circuit.

* * * * *